United States Patent
Fuller et al.

(10) Patent No.: US 7,478,025 B1
(45) Date of Patent: Jan. 13, 2009

(54) SYSTEM AND METHOD TO SUPPORT DYNAMIC PARTITIONING OF UNITS TO A SHARED RESOURCE

(75) Inventors: Douglas A. Fuller, Eagan, MN (US); David P. Williams, Mounds View, MN (US)

(73) Assignee: Unisys Corporation, Blue Bell, PA (US)

( * ) Notice: Subject to any disclaimer, the term of this patent is extended or adjusted under 35 U.S.C. 154(b) by 849 days.

(21) Appl. No.: 10/418,887

(22) Filed: Apr. 18, 2003

(51) Int. Cl.
*G06F 17/50* (2006.01)

(52) U.S. Cl. ........................................................ 703/13

(58) Field of Classification Search ................. 710/104, 710/111, 116, 123; 703/13, 23, 34
See application file for complete search history.

(56) References Cited

U.S. PATENT DOCUMENTS

| | | | | |
|---|---|---|---|---|
| 5,301,283 A | * | 4/1994 | Thacker et al. | 710/116 |
| 5,430,848 A | * | 7/1995 | Waggener | 710/123 |
| 5,440,698 A | * | 8/1995 | Sindhu et al. | 709/225 |
| 5,506,971 A | * | 4/1996 | Gullette et al. | 710/116 |
| 5,572,687 A | * | 11/1996 | Alnuweiri | 710/123 |
| 5,862,353 A | * | 1/1999 | Revilla et al. | 710/107 |
| 6,112,272 A | * | 8/2000 | Gates | 710/110 |
| 6,304,923 B1 | * | 10/2001 | Klein | 710/41 |
| 6,647,508 B2 | * | 11/2003 | Zalewski et al. | 714/3 |
| 6,952,746 B2 | * | 10/2005 | Capps et al. | 710/104 |
| 2002/0147875 A1 | * | 10/2002 | Singh et al. | 710/305 |

* cited by examiner

*Primary Examiner*—Paul L Rodriguez
*Assistant Examiner*—Eunhee Kim
(74) *Attorney, Agent, or Firm*—Charles A. Johnson; Robert Marley; Hollingsworth & Funk LLC (57) ABSTRACT

A system and method for performing dynamic partitioning operations within a data processing system is disclosed. According to one embodiment, the current invention provides a system that allows an unit to be added to an executing data processing partition. The partition may include a shared resource that is receiving requests from other units that are already included within the partition. The inventive system includes means for programmably enabling the unit to the shared resource. Once the unit is so enabled, the system synchronizes the request arbitration being performed by this unit with the arbitration activities occurring within other units requesting access to the shared resource. This synchronization process prevents two units from attempting to simultaneously access the shared resource.

30 Claims, 4 Drawing Sheets

SYSTEM AND METHOD TO SUPPORT DYNAMIC PARTITIONING OF UNITS TO A SHARED RESOURCE

FIELD OF THE INVENTION

This invention relates generally to data processing systems, and more particularly to an improved system and method for dynamically partitioning units of a multi-processor system.

BACKGROUND OF THE INVENTION

Ever increasing demand for high throughput data processing systems has caused computer designers to develop sophisticated multi-processor designs. Initially, additional processors were provided to improve the overall bandwidth of the system. While the additional processors provided some level of increased performance, it became evident that further improvements were necessary.

One way to improve system performance involves the use of partitioning. Partitioning refers to the allocation of the system's data processing resources to a number of predefined "partitions". Each partition may operate independently from the other partitions in the system. Using partitioning, a number of parallel tasks may be executed independently within the system. For example, a first portion of the system resources may be allocated to a first partition to execute a first task while a second portion of the system resources may be allocated to a second partition to execute a second task.

System resources may be allocated to partitions by a system controller. The controller allocates resources to the various partitions based on the task being performed by each partition. For example, a large task may require more system resources than a small task. A system controller may therefore add resources to the partition of the system servicing the large task, and may delete resources from a partition servicing a smaller task, thereby increasing the efficiency of the overall system.

In many cases involving the allocation of resources to a partition, one or more of the other units already residing within the partition must be stopped before the allocation operation can be completed. This type of partitioning, known as "static partitioning", involves halting normal processing activities and, in some cases, stopping one or more system clocks, before a unit may be added or removed from a partition. This is necessary to ensure that when the partition begins executing with the additional resources, all resources are in a consistent, known state.

In more recent years, strides have been made to allow "dynamic partitioning" operations to occur for some system configurations. Dynamic partitioning operations allow resources to be allocated to, or de-allocated from, a partition without requiring that all processing activities occurring within that partition be stopped. Dynamic partitioning activities may be performed while the system clocks are running. Dynamic partitioning is more efficient, since processing is allowed to continue while the partitioning operation is occurring.

A major step in dynamic resource allocation was to provide input/output subchannels with the capability of dynamic allocation as taught in U.S. Pat. No. 4,437,157, issued to Witalka et al. Logical file designations for peripheral devices is suggested by U.S. Pat. No. 5,014,197, issued to Wolf. Similarly, U.S. Pat. No. 4,979,107, issued to Advani et al., suggests logical assignment of peripheral subsystem operating parameters.

The capability to reconfigure has been used in a number of systems applications, U.S. Pat. No. 4,070,704, issued to Calle et al., provides a boot strap program with the capability to change the initial load peripheral device upon determination of a failure in the primary loading channel. Perhaps the most often stated purpose for reconfiguration is to provide some degree of fault tolerance. U.S. Pat. No. 4,891,810, issued to de Corlieu et al., and U.S. Pat. No. 4,868,818, issued to Madan et al., suggest system reconfiguration for that reason. A related but not identical purpose is found in U.S. Pat. No. 4,888,771, issued to Benignus et al., which reconfigures for testing and maintenance.

The capability to reconfigure a data processing system can support centralized system control as found in U.S. Pat. No. 4,995,035, issued to Cole, et al. A current approach involves the assignment of logical names for resources as found in U.S. Pat. No. 4,245,306, issued to Besemer et al. and U.S. Pat. No. 5,125,081, issued to Chiba. An extension of the capability to identify resources by logical names is a virtual system in which the user need not be concerned with physical device limitations, such as suggested in U.S. Pat. No. 5,113,522, issued to Dinwiddie, Jr. et al.

Although some strides have been made in the ability to dynamically partition units in some system configurations, other system configurations have not readily permitted dynamic partitioning activities. For example, in data processing systems in which multiple units such as processors share a common resource such as a bus, it has been difficult to allow units to dynamically enter into, or be removed from, a running partition. The difficulties are largely related to the fact that arbitration activities must be synchronized to prevent multiple units from inadvertently attempting to simultaneously acquire access to the shared resource. This is because prior art systems could only synchronize arbitration activities after processing was halted.

For example, one way to address the type of problems described above involves halting all requests being made to the shared resource. In one embodiment, an operating system prevents all processors from making any further requests to a shared bus. Another unit is then selected for addition to the partition. The newly-added unit and all halted units are initialized to a common state that will allow execution to be resumed in an orderly fashion. This common state will indicate which unit will first acquire access to the bus. This state may also, in some cases, determine the priority scheme that will be used to grant access to the bus.

As may be appreciated, halting bus activities to add or remove a unit to an existing partition results in lost processing throughput, since normal processing activities must be temporarily suspended. One way to address this problem involves limiting the number of units using a shared resource. For example, assume that, at most, two units are coupled to a bus. Further assume that a running partition includes one of these units that is making requests to the bus. The second unit may be added to this partition without the need to synchronize any arbitration activities, since the second, newly added unit is guaranteed the right to obtain access to the bus after the other unit relinquishes control over that resource. In this instance, it is unnecessary to halt the partition to add another unit.

As is evident from the example above, limiting the number of units that have access to a shared resource may allow dynamic partitioning to be completed without stopping normal processing activities. However, this solution is not acceptable for larger-scale systems that allow more than two units to share a resource such as a bus. What is needed, therefore, is an improved system and method for performing dynamic partitioning activities that address the foregoing problems and challenges.

SUMMARY OF THE INVENTION

The current invention provides an improved system and method for performing dynamic partitioning operations within a data processing system. According to one aspect of the invention, a system is provided to allow a unit to be added to an executing data processing partition that includes a shared resource that is receiving requests from other units that are already included within the partition. The inventive system includes an interface enable circuit that can be dynamically scanned to enable the unit to the shared resource. Once the unit is so enabled, the system dynamically synchronizes the arbitration activities of this newly enabled unit to the arbitration that is being performed by other units that were already enabled to the shared resource. In this manner, the partition continues to execute without two units attempting to gain simultaneous access to the shared resource.

In one particular embodiment, the shared resource is a communication network such as a bus. The additional unit may be any unit that is coupled to make requests to the communication network, such as a processor, a cache, or a bus controller. The additional unit is added to a running partition by enabling an interface circuit that allows the unit to communicate with the communication network. Once the additional unit is so enabled, any requests that are pending to the communication network from any of the other units can be monitored. Moreover, it can be determined when any of the other units relinquishes control of the communication network. According to one aspect of the invention, this determination is made using a snapshot circuit that obtains successive snapshots of pending requests to determine when a request has been satisfied such that the requesting unit is surrendering control of the network.

After it has been determined that a unit is relinquishing control of the shared resource such as a communication network, a predetermined priority scheme is used to determine which of the units may next acquire the resource. This is done based on the identity of the unit relinquishing control of the resource, and further based on the requests that are pending to the resource. This process affectively synchronizes any request arbitration performed by the additional unit to the arbitration activities that are underway within the other executing units within the running partition. In one embodiment, the priority scheme used to perform arbitration is programmable.

According to another aspect of the invention, the additional unit may be placed in a paused state after it has been added into the running partition. In the paused state, the unit will temporarily be prevented from making requests to the shared resource. This affectively modifies the predetermined priority scheme to allow higher priority requests to gain access more quickly to the shared resource. The unit may be placed within the paused state using a dynamic scan operation.

In one embodiment, a system is provided for dynamically adding an additional unit to a data processing partition. The partition includes multiple other units coupled to a shared resource. The system includes a snapshot circuit to determine when one of the multiple other units has relinquished control of the shared resource. The system further includes priority logic coupled to the snapshot circuit to synchronize request arbitration performed by the additional unit to request arbitration being performed by the multiple other units based on which unit relinquished control of the shared resource.

According to another aspect of the invention, a data processing system is provided that comprises a shared resource, and multiple units each coupled to make requests to the shared resource. At least one of the multiple units is associated with a respective dynamic partitioning system that is capable of enabling the respective one of the multiple units to the shared resource while requests are pending to that resource from another unit that is already included within the partition. The dynamic partitioning system comprises interface logic to allow the respective unit to be selectively enabled to the shared resource, and snapshot logic coupled to the interface logic to identify any one of the multiple other units currently granted access to the shared resource. The partitioning system also includes priority logic coupled to the snapshot logic to dynamically synchronize, based on which unit is identified by the snapshot logic, arbitration performed by the respective one of the multiple units to the arbitration performed by each of the other ones of the multiple units.

In yet another embodiment, a method for dynamically adding a unit to an executing partition of a data processing system is disclosed. The partition includes multiple other units making requests to gain access to a shared resource based on a predetermined priority scheme. The method includes enabling the unit to the shared resource, identifying any one of the multiple other units relinquishing access to the shared resource, and synchronizing the unit with the predetermined priority scheme based on the identity of the one of the multiple other units.

According to still another aspect of the invention, a partitioning system for adding an additional unit to an operational data processing partition is provided. The partition includes multiple other units coupled to a shared resource. The partitioning system comprises snapshot means for identifying one of the multiple other units relinquishing access to the shared resource within a predetermined period of time, and priority logic means for granting access to the shared resource based on a predetermined priority scheme, and for utilizing an identity of the one of the multiple units to synchronize any requests from the additional unit with the predetermined priority scheme.

Other aspects and embodiments of the invention will become apparent from the description that follows and the accompanying drawings.

DETAILED DESCRIPTION OF THE DRAWINGS

Figure 1:
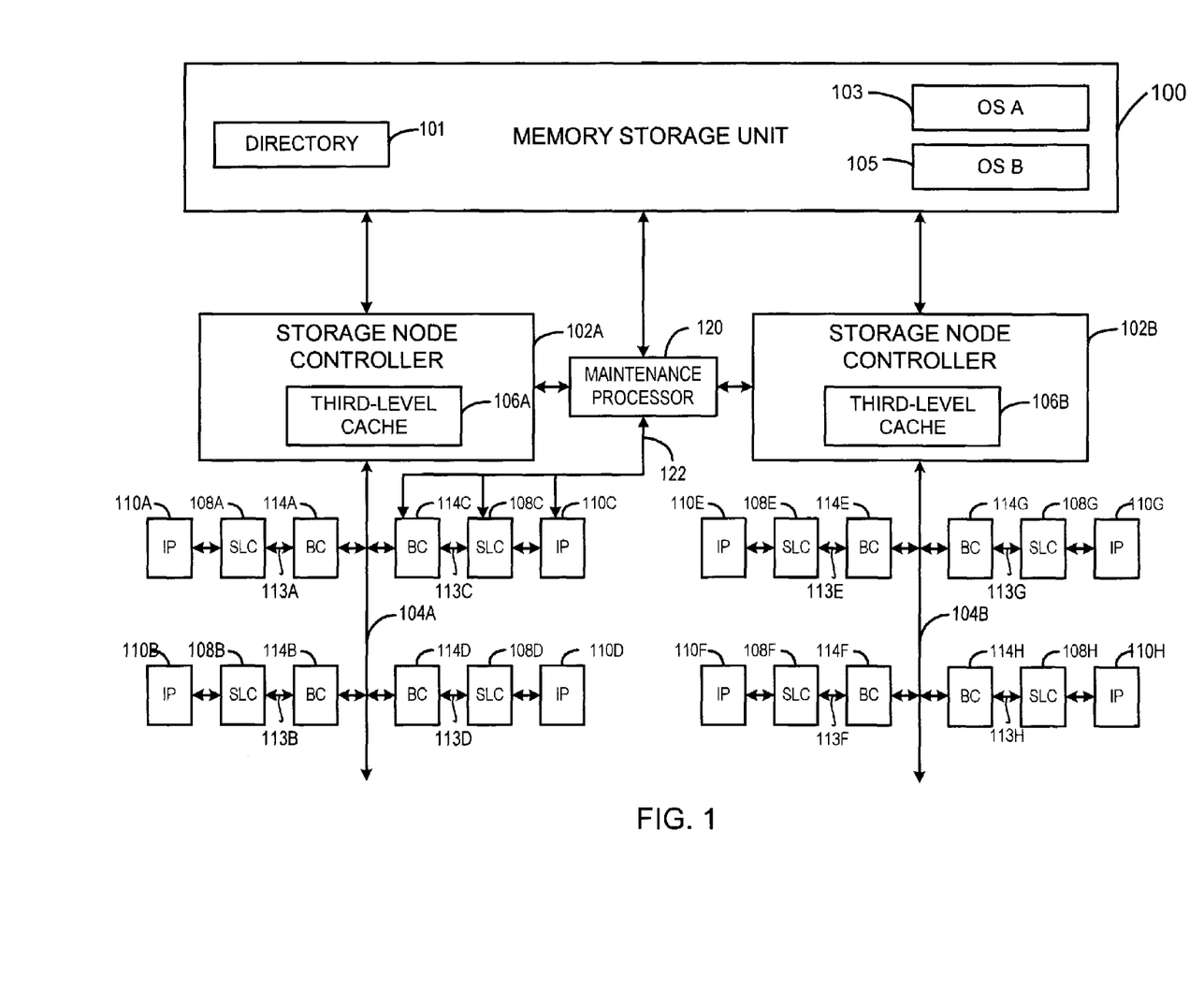
FIG. 1 is a block diagram of an exemplary data processing system of the type that may employ the current invention.

FIG. 1 is a block diagram of an exemplary data processing system that may employ the current invention. The exemplary system of FIG. 1 includes a memory storage unit (MSU) 100 that provides the main memory facility for the system. MSU 100 may include random access memory (RAM), read-only memory (ROM), and any other type of memory known in the art. MSU 100 may be subdivided into multiple subunits (not shown) in a manner largely beyond the scope of the current invention.

In one embodiment, MSU is a directory-based storage unit. In this embodiment, MSU retains information in directory 101 that indicates where the latest copy of requested data resides within the system. This is necessary since data from MSU 100 may be copied into any of the various cache memories within the system. Directory 101 tracks the latest copy of the data to ensure that every processor is operating from this copy. In the current embodiment, directory 101 includes a directory entry that tracks the location of each 128-byte block of memory within the MSU, where a 128-byte block is referred to as a cache line.

In one embodiment, multiple operating systems may be loaded into MSU 100. These operating systems (OSes) are shown as OS A 103 and OS B 105. Various units in the data processing system of FIG. 1 may be assigned to, and running under the control of OS A 103. These units operate together in a "partition" to accomplish assigned processing tasks. Likewise, other units in the data processing system may be running under the control of OS B 105 in a different partition to accomplish additional processing tasks. Through the use of multiple partitions, more than one processing tasks may be completed simultaneously in a manner to be discussed further below.

In the exemplary system of FIG. 1, MSU 100 is coupled to one or more Storage Node Controllers (SNCs) shown as SNCs 102A and 102B. The system of the current invention may include more or fewer SNCs than are shown in FIG. 1. Each SNC is coupled to MSU 100 over one or more high-speed MSU interfaces that each includes data, address, and function lines. For simplicity, each SNC is shown coupled to MSU 100 over a single interface.

Each SNC includes logic to interface to the high-speed MSU interface, and further includes logic to interface to a respective processor bus such as processor buses 104A and 104B. These processor buses may be referred to as front-side buses. These processor buses can employ any type of bus protocol. Each SNC may further include a respective cache and all supporting logic. This cache may be a Third-Level Cache (TLC), a Fourth-Level Cache (4LC), or some other type of cache memory. In the embodiment shown, SNCs 102A and 102B include TLCs 106A and 106B, respectively.

As noted above, each of SNCs 102A and 102B is coupled to a respective processor bus 104A and 104B. In the current embodiment, each processor bus further couples to between one and four Bus Controllers (BCs) 114. In another embodiment, more than four BCs may interface to a processor bus. Each BC is further coupled to a respective second-level cache (SLC) over a respective dedicated interface. For example, BCs 114A-114D are coupled to SLCs 108A-108D over interfaces 113A-113D, respectively. Similarly, BCs 114E-114H are coupled to SLCs 108E-108H over interfaces 113E-113H, respectively. In another embodiment, one or more of the SLCs may be Third-Level Caches. Each BC controls the transfer of data between a respective SLC and processor bus in a manner that conforms to bus protocol.

Each SLC 108 is also coupled to a respective one of the Instruction Processors (IPs) 110-110H over a respective interface. For example, SLC 108A is coupled to IP 110A, SLC 108B is coupled to IP 110B, and so on. An IP may be any type of processor such as a 2200™ processor commercially available from Unisys Corporation, a processor commercially available from Intel Corporation, or any other processor known in the art. Each IP may include one or more on-board caches. In the current embodiment, each IP includes a First-Level Cache (FLC). Preferably, each IP resides on a single Application Specific Integrated Circuit (ASIC) device with a respective SLC 108. Alternatively, an IP may be coupled to a respective SLC over an external interface. The associated BC may or may not be integrated with the SLC logic, and may also reside within the same ASIC.

An SNC, its respective processor bus, and the entities coupled to the processor bus may be referred to as a "processing node". In the current example, SNC 102A, processor bus 104A, and all entities associated with processor bus including BCs 114A-114D, SLCs 108A-108D, and IPs 110A-110D may be referred to as a processing node. Similarly, SNC 102B, processor bus 104B, and all entities associated with processor bus 104B comprise a second node.

During execution, an IP is accessing programmed instructions and data from MSU 100 and its respective caches. For example, when IP 110A requires access to a memory address, it first attempts to retrieve this address from its internal cache(s) such as an FLC. If the requested address is not resident in the FLC, a request is sent to the respective SLC 108A. If the requested data is likewise not resident within the SLC, the SLC forwards the request to the processor bus 104A.

In one embodiment, all SLCs on a processor bus implement a snoop protocol to monitor, or "snoop", the processor bus for requests. In the current example, SLCs 108B-108D snoop the request provided by SLC 108A on processor bus 104A. If any of these SLCs stores the requested data, it will be returned to requesting SLC 108A via processor bus 104A. Additionally, SLCs 108B-108D may have to invalidate any stored copies of the data depending on the type of request made by SLC 108A. This is discussed further below.

SNC 102A also snoops the request from SLC 108A. SNC 102A determines whether TLC 106A stores the most recent copy of the requested data. If so, the data will be provided by SNC 102A to the SLC 108A.

In some instances, data requested by IP 110A is not resident within any of the cache memories associated with processor bus 104A. In that case, SNC 102A must forward the request to MSU 100. MSU 100 determines the location of the current copy of the requested data using information stored within its directory 101. The most current copy may reside within the MSU itself, or may reside within a cache memory that is associated within one or more other nodes in the system, as indicated by state bits within directory 101. In the former case, the MSU provides the data directly to SNC 102A. In the latter case, the MSU must issue a "return" command to these other node(s) requesting that the data be returned to MSU 100 so that it may be forwarded to SNC 102A.

FIG. 1 also includes a maintenance processor 120. The maintenance processor controls the initialization, error reporting, error recovery, and partitioning actions that are associated with the various units in the data processing system. The maintenance processor may be coupled to one or more of the units in the system across a scan interface 122, as is known in the art. This interface can be used to perform a serial scan operation to read and/or change the states of predetermined state devices within the units. For example, this interface can be used to enable and disable interface bits that are used to add or remove a unit from an existing partition, as will be discussed further below. In FIG. 1, maintenance processor 120 is shown coupled via scan interface 122 to BC 114C, SLC 108C, and IP 110C, although it will be understood maintenance processor 120 would generally be coupled in some manner to most, or all, of the units in the system.

It will be understood that the data processing system of FIG. 1 is merely exemplary. That system may include more or fewer SNCs, SLCs, and/or IPs. The system may include other types of units, or may omit some of the units shown in FIG. 1. Additionally, many other types of system architectures may usefully employ the current invention as will be apparent from the following discussion.

As discussed above, according to one aspect of the invention, multiple operating systems may be loaded into MSU 100. Each operating system is executed on a respective one of IPs 110. Each operating system controls a respective partition, which is a grouping of units within the system that are operating together to perform one or more assigned tasks. For example, a first partition may be operating under the control of OS A 103. This partition may comprise some or all of the units contained in the node including SNC 102A. A second partition containing some or all of the units in the remaining node containing SNC 102B may be operating under the control of OS B 105. In another example, units of one node may reside within a first running partition, and other units from this same node may be placed in a second "maintenance partition" created to perform re-initialization, testing, and/or maintenance activities on those other units as may be necessitated by hardware or software problems.

When a partition is created, the various units that will be included within the partition are configured so that they are able to interact with one another. This allows these units to function together to perform the tasks that will be assigned to that partition. To perform this configuration, maintenance processor 120 sets predetermined state devices within the system to enable interfaces, allowing a unit to join an existing partition. For example, assume that a partition exists that contains SNC 102A, IP 110A, SLC 108A, and BC 114A. IP 110C is to be added to the partition along with SLC 108C and BC 114C. One of the tasks that must be performed to accomplish this addition could involve enabling state devices within BC 114C to allow that bus controller to communicate with processor bus 104A and with interface 113C. This allows IP 110C to enter the partition. In a similar manner, disabling of the state devices could be performed as part of the activity of removing these units from the partition.

As discussed above, maintenance processor 120 and scan interface 122 are used to perform scan operations that add or remove a unit to or from an existing partition. In some cases, these scan operation can only be performed "statically". That is, the scan operation cannot be performed until normal processing operations are halted, and, in some instances, only after one or more system clocks are stopped. This may be necessary to ensure that units are brought into the partition in a stable, known state.

As may be appreciated by those skilled in the art, utilizing a static scan operation to bring a unit into a running partition is not desirable since this operation disrupts normal processing activities. In an environment wherein the data processing configuration is regularly modified to achieve maximum throughput, stopping processing activities each time the system is re-partitioned can significantly impact system performance.

In systems having shared resources such as processor buses 104A and 104B of FIG. 1, partitioning operations can be particularly challenging. It is highly undesirable to halt the shared resource to allow a static partitioning operation to occur. However, these types of configurations utilize arbitration mechanisms that must be synchronized to prevent multiple units from inadvertently attempting to gain simultaneous access to the shared resource. It is difficult to synchronize the arbitration mechanism without stopping normal processing activities.

One way this problem has been addressed in prior art systems is to create partitions that include the maximum foreseeable configuration so that no arbitration synchronization needs to be performed. For example, in a system including multiple units coupled to a shared communication interface such as a bus, a partition that includes the bus will also always include all of the multiple units. If this partition includes more units than are initially needed, the "extra" units are placed in an inactive state. In this scenario, a partition including processor bus 104A (FIG. 1) will also always include all IPs 110 and associated SLCs 108 and BCs 114 interfacing to this bus, regardless of whether these units are initially needed within the partition. If not all of the processors are required to perform the tasks that are first assigned to the partition, the IPs that are not required will begin executing a looping software construct that does not perform useful work. When these IPs are required for execution, the operating system provides a signal such as an interrupt that will cause each processor to begin executing within the partition. This effectively brings the IPs into the partition without requiring any partitioning operations that would necessitate halting processing activities or stopping system clocks.

Several problems exist with prior art systems such as those discussed above. First, when a unit is in an inactive state, it is not isolated from the running partition. Because all interfaces are enabled, any hardware or software problems that may be associated with the unit could potentially affect the operational units, creating system errors. Additionally, if a unit is determined to be faulty within a system that does not support dynamic partitioning activities, the entire running partition must be stopped to remove the unit from the partition. Finally, the above-described prior art system requires that, in some situations, maximum-sized partitions be created even if such partitions are not always required. This results in wasted processing capacity.

Another prior art approach to dynamically adding units to a partition that includes a shared resource involves limiting the number of units having access to the shared resource. For example, if at most two units are interfaced to a shared bus such as processor bus 104A, the synchronization activities performed during dynamic partitioning can be greatly simplified. This is discussed further in reference to FIG. 2.

Figure 2:
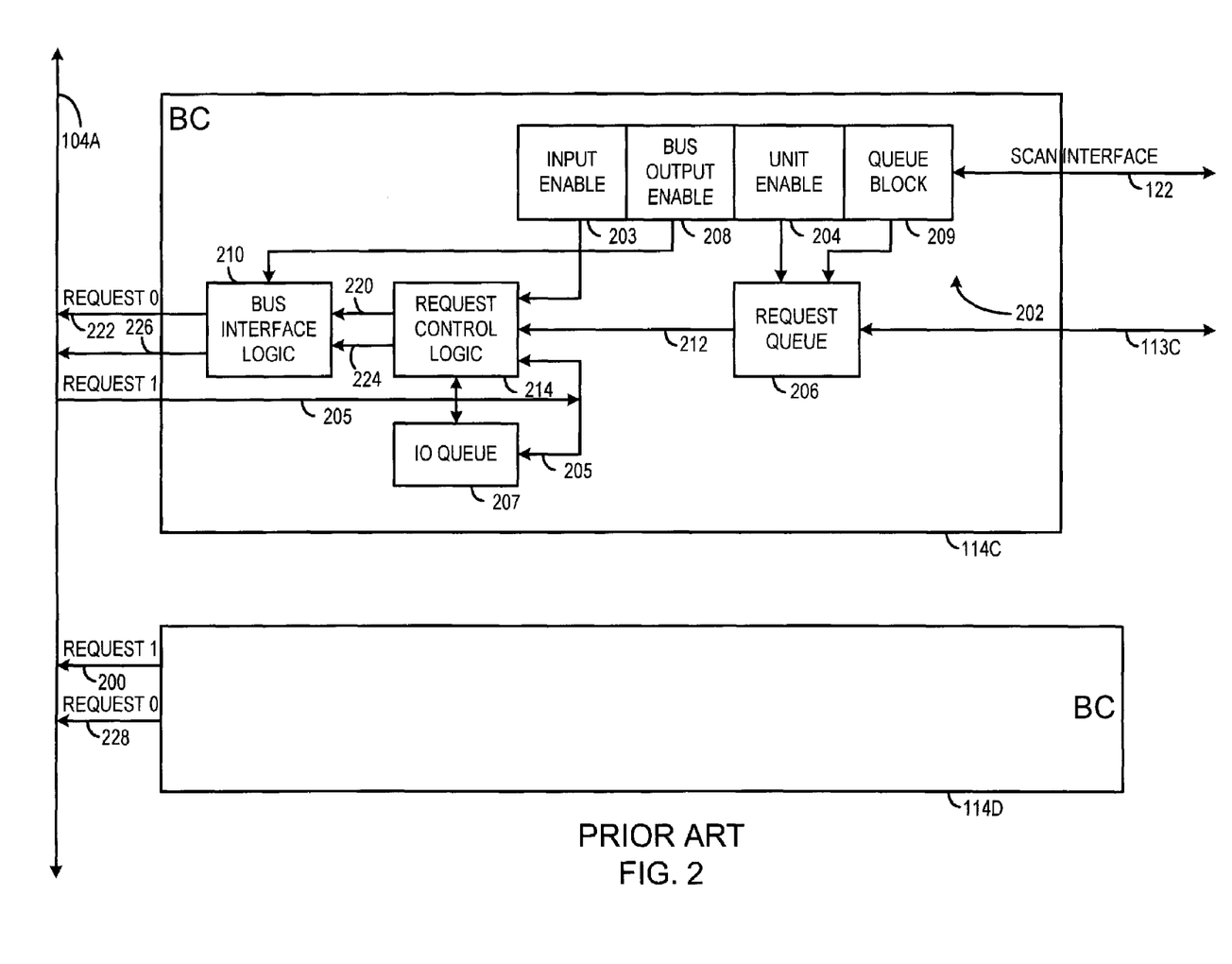
FIG. 2 is a block diagram of an exemplary prior art system for partitioning units to a bus.

FIG. 2 illustrates a prior art system used to dynamically partition a unit such as BC 114C to a bus such as processor bus 104A. In this prior art system, processor bus 104A interfaces to only two BCs, shown as BC 114C and BC 114D. It will be assumed that BC 114D and its associated units, which includes SLC 108D and IP 110D (not shown in FIG. 2) are running within the partition. When IP 110D makes a request that results in a cache miss within SLC 108D, this SLC issues a memory request to BC 114D. In turn, BC 114D issues a request on processor bus 104A by asserting a request line shown as request1 signal 200.

While BC 114D is making requests, a human or some automated intervention process determines that BC 114C and its associated SLC 108C and IP 110C is to be added to the running partition. As a result, an operating system such as OS A 103 that is controlling the partition performs certain steps to add these units to the partition. In the system of FIG. 2, OS A will first initiate a static scan operation whereby maintenance processor 120 initializes the units to be added to the partition via scan interface 122. Next, maintenance processor begins the process of enabling BC 114C to processor bus 104A. To do this, maintenance processor dynamically scans dynamic scan register 202 to activate input enable bit 203. This allows request control logic 214 to begin monitoring signals provided on lines 205 from processor bus 104A.

Request control logic 214 also interfaces with an IO queue 207. During normal operations, this IO queue operates under control of request control logic 214 to store all requests that appear on processor bus 104A. This includes requests made by either BC 114C or 114D. Request control logic 214 monitors these stored requests to verify that each request is matched with a subsequent response. When BC 114C is added to a running partition, care must be taken so that a response is not entered into IO queue 207 if that response corresponds with a request that was issued before BC 114C began monitoring the bus. If this occurs, a request/response mismatch occurs that will ultimately result in an error.

To prevent request/response mismatch within IO queue 207, any requests being issued by BC 114D to processor bus 104A are temporarily suspended as follows. Maintenance processor scans BC 114D, which includes logic similar to that shown for BC 114C. In particular, maintenance processor sets queue block bit 209 within dynamic scan register 202 of BC 114D. This temporarily prevents new requests from entering request queue 206 of BC 114D. All requests that are already stored within request queue 206 of BC 114D are issued to processor bus 104A so that they may be completed in a normal fashion. Thereafter, processor bus 104A will enter an idle state, which allows request control logic 214 of BC 114C to begin monitoring IO queue 207 in a manner that will not result in a request/response mismatch. After an idle cycle, request queue 206 of BC 114D automatically begins accepting requests.

Maintenance processor 120 performs several additional scan operations to complete the partitioning activities. First, within BC 114C, bus output enable bit 208 of dynamic scan register 202 is activated. This allows BC 1114C to begin making requests to processor bus 104A. The maintenance processor also activates unit enable bit 204 to allow request queue 206 of BC 114C to begin receiving requests on interface 113C from SLC 108A. Finally, maintenance processor will perform other scan operations to enable interfaces within SLC 108C and IP 110C, thereby allowing these units to be added to the partition. This process is largely beyond the scope of the current invention.

After all interfaces are enabled, a message is issued to IP 110C to cause it to begin execution within the partition. During execution, IP 110C will make memory requests to SLC 108C. If any request results in a cache miss, the request is forwarded to request queue 206 of BC 114C via interface 113C.

When a request is stored within request queue 206, a signal on line 212 is activated to request control logic 214. Request control logic 214 will control the presentation of this request to processor bus 104A when BC 114C gains the right to drive the bus. Request control logic 214 determines whether BC 114C has the right to drive the bus based on whether BC 114D is making a request on processor bus 104A at that time as indicated by the activation of the request1 signal on line 218. If request1 signal is activated, request control logic 214 waits for this signal to be deactivated by BC 114D. When this occurs, BC 114D has completed any current use of the bus, and request control logic 214 is then allowed to activate signal 220, which is provided to bus interface logic 210. Bus interface logic asserts a requesto signal 222 on processor bus 104A to indicate that BC 114C is now making a request on the bus. Request control logic 214 provides additional address, data, and control signals on lines 224, which are driven by bus interface logic 210 on lines 226 to processor bus 104A in a manner that is beyond the scope of this invention. When the request is completed, request control logic 214 deactivates line 220, causing requesto signal 222 to be deactivated.

BC 114D is monitoring the request o signal on line 228. When this signal is deactivated, BC 114D may again assume control of processor bus 104A.

In the foregoing example, IP 110C is brought into a running partition without halting processing activities or system clocks. Therefore, the partitioning operation does not diminish processing throughput. This dynamic partitioning operation is possible because there is only a single unit, BC 114D, that is making requests to processor bus 104A when the second unit, BC 114C, enters the partition and is enabled to processor bus 104A. As a result, when BC 114C is brought into the running partition that already includes BC 114D, BC 114C is able to make a request as soon as BC 114D relinquishes the bus, and no arbitration process is needed. However, the system of FIG. 2 could not be used to dynamically enable a unit to a shared resource such as processor bus 104A if more than one operational unit were making requests to processor bus 104A, since this would involve some type of bus arbitration process. If an arbitration process is necessary, the arbitration logic of all units must be synchronized so that each unit is aware of the next unit to gain access to the bus. Otherwise, two units may attempt to drive the bus simultaneously. The current invention provides a means for synchronizing the arbitration logic of multiple units coupled to make requests to a shared resource. This is described in the following paragraphs.

Figure 3:
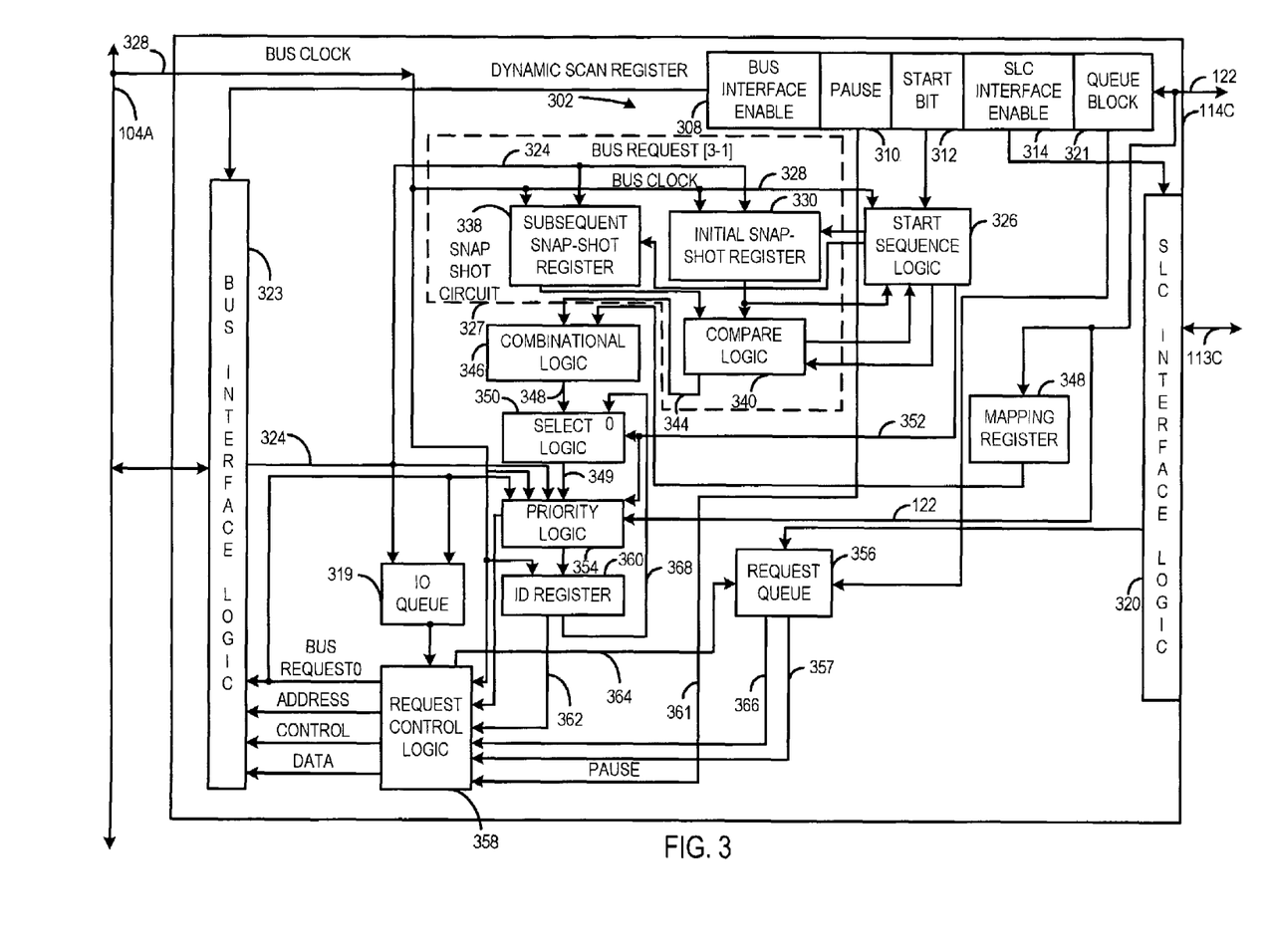
FIG. 3 is a block diagram of one embodiment of the current invention.

FIG. 3 is a block diagram of one embodiment of the current invention. This system allows multiple units to continue making requests to a shared resource such as a bus while another unit is being enabled to that shared resource. While an exemplary embodiment of the system is shown to involve BC 114C and processor bus 104A, this system can be adapted for use with any type of unit that is coupled to any type of resource that is shared between two or more units.

The system of FIG. 3 includes dynamic scan register 302 coupled to scan interface 122. This register contains several fields that are used to dynamically add BC 114C to a running partition, including a bus interface enable field 308, a pause bit 310, start bit 312, and SLC interface enable bit 314. The use of dynamic scan register 302 is best understood by example.

When a unit such as BC 114C is added to a running partition, maintenance processor 120 performs a static scan operation to initialize the unit. A dynamic scan operation is then executed to set bus interface enable field 308 to a value that will cause bus interface logic to allow BC 114C to monitor signals on processor bus 104A. In particular, request signals, shown as bus request[3-1], are received by BC 114C on lines 324. These bus request signals are each driven by a respective one of BC 114A, BC 114B, and BC 114D (FIG. 1) if the respective BC is enabled to processor bus 104A as part of a running partition. If a BC 114 is not enabled to processor bus 104A, the respective bus request signal is held inactive. According to one embodiment, bus interface logic 323 does not allow BC 114C to drive processor bus 104A at this time.

BC 114C includes an IO queue 319 that is similar to that described above in regards to FIG. 2. This IO queue is used by request control logic 358 to match requests and responses appearing on processor bus 104A. To prevent request/response mismatches, any requests being issued by any BC 114 to processor bus 104A are temporarily suspended in the manner discussed above. That is, maintenance processor 120 scans a dynamic scan register such as dynamic scan register 302 within each of the other BCs. This scan operation sets a queue block bit 321 that is similar to queue block bit 209 of FIG. 2. This temporarily prevents new requests from entering the respective request queue 356. When all requests in each of the request queues have been issued to processor bus 104A, processor bus 104A enters an idle state. This allows request control logic 358 of BC 114C to begin monitoring IO queue 319 in a manner that will not result in a request/response mismatch. After an idle cycle, request queues 356 within the other BCs in the partition are automatically enabled to begin receiving requests.

Next, bus interface enable field 308 is scanned to a state that allows BC 114C to both receive signals from, and drive signals onto, processor bus 104A. Additionally, SLC interface enable bit 314 is activated to allow SLC interface logic 320 to begin receiving requests from SLC 108C across interface 113C.

After activating SLC interface enable 314 and bus interface enable 308, a scan operation is performed to set start bit 312, which activates start sequence logic 326. Start sequence logic then issues a series of control signals to snapshot circuit 327 (shown dashed). This initiates a control sequence that synchronizes bus arbitration being performed by BC 114C to arbitration activities being performed by BCs 114A, 114B, and 114D. In particular, start sequence logic 326 receives a bus clock signal from processor bus 104A on line 328. Sometime thereafter, start sequence logic provides an enable signal to an initial snapshot register 330. This initial snapshot register 330, which also receives bus clock signal 328 from processor bus, receives the bus request[3-1] signals on lines 324.

When initial snapshot register 330 is enabled by start sequence logic 326, a snapshot of the bus request[3-1] signals on lines 324 is captured by the next active edge of bus clock signal 328. If start sequence logic 326 determines that initial snapshot register 330 captured at least one active bus request, indicating at least one of BCs 114A, 114B, and 114D have a request pending on processor bus, start sequence logic disables the initial snapshot register 330. Otherwise, start sequence logic 326 allows initial snapshot register 330 to remain enabled for additional bus clock cycles until at least one request is captured. Thereafter, start sequence logic 326 disables initial snapshot register 330.

After initial snapshot register 330 stores at least one bus request, start sequence logic 326 enables subsequent snapshot register 338. Upon receipt of the next active edge of bus clock signal 328, subsequent snapshot register 338 captures bus request[3-1] signals 324. After these signals are captured, start sequence logic 326 enables compare logic 340 to compare the bus request signals captured by initial snapshot register 330 to those captured by subsequent snapshot register 338. In particular, compare logic 340 includes combinational logic that determines whether a bus request signal that had been asserted during capture of the initial snapshot has been deactivated in the subsequent snapshot stored by subsequent snapshot register 338. If not, start sequence logic 326 continues to enable subsequent snapshot register 338 to capture bus request[3-1] signals 324 on each active edge of bus clock signal 328.

Eventually, a bus request signal that had been asserted during the initial snapshot will be de-activated during a subsequent snapshot, as is detected by compare logic 340. This indicates that one of BCs 114A, 114B, and 114D has relinquished control of the bus. An indication as to which of the bus request signals was deactivated is provided on line 344 to combinational logic 346. Combinational logic uses a predetermined mapping function to map the identified one of bus request[3-1] signals to a predetermined one of BC 114A, 114B, and 114D. Any predetermined mapping function may be utilized. In one embodiment, the mapping function is programmable using programmable scan-set registers such as mapping register 348, which may be initialized during power-on of the system by scan set interface 122. Depending on the mapping function that is used, combinational logic 346 provides an indication on lines 348 as to which of BC 114A, 114B, and 114D most recently relinquished control of processor bus 104A.

Select logic 350 receives the signals on lines 348. These signals are selected by select logic if select signal 352 is activated by start sequence logic 326, as will occur when the BC 114C is first being added into the partition. The signals on lines 348 are forwarded to priority logic 354 on lines 349.

Priority logic 354 implements a predetermined priority scheme to determine which unit has priority to gain access to processor bus 104A next. This determination is made based on which unit just relinquished control of processor bus 104A, as indicated by the signals on lines 349. This determination is further based on which requests from BCs 114B-114D are still pending on processor bus, as indicated by bus request1 through bus request3 on lines 324. Finally, the priority scheme takes into account whether SLC 108C has provided one or more bus requests to request queue 356 of BC 114C following the enabling of SLC interface logic 320. If such a request is pending within request queue 356, the bus request0 signal on line 359 will be activated. This signal is driven onto processor bus 104A in a manner that conforms to timing requirements of processor bus 104A to ensure that instability issues are not created within the logic of BCs 114A, 114B, and 114D. This signal is also provided to priority logic 354 for use in determining the next unit to gain priority to the bus.

In one embodiment, priority logic 354 utilizes a predetermined rotating priority scheme to determine which of the pending bus requests will next gain priority to the bus, although any type of priority scheme may be utilized. According to one aspect of the invention, the priority scheme may be programmable using scan interface 122. Using this priority scheme, priority logic 354 provides an identification to ID register 360 indicating which BC will next gain access to processor bus 104A. This unit identification is also provided to request control logic 358.

If BC 114C has been identified as having priority to access processor bus 104A, as indicated by signals 362, request control logic 358 provides control signals on lines 364 to control the transfer of a request from request queue 356 to request control logic 358 on lines 366. Request control logic 358 then drives the request address, control signals, and, if necessary, data, onto processor bus 104A in accordance with the protocol implemented by processor bus 104A. Request processing proceeds according to bus protocol.

It may be noted that the above-described synchronization mechanism is intended for use only when a unit is being added to an already operational partition. For example, if the partition described above did not include at least one BC 114 that is making requests to processor bus 104A, snapshot logic 327 will not be effective in detecting a deactivated request signal. As such, the start sequence described above will not run to completion. Therefore, static scan operations are employed when a new partition is being created, or when a halted partition is being re-started, as is discussed above.

After the initial start sequence has completed, start sequence logic 326 deactivates the select signal on line 352. This allows select logic 350 to select the signals on lines 368 stored by ID Register 360. These signals identify the unit that has gained access to processor bus 104A. Deactivation of the select signal on line 352 further causes priority logic to 354 to monitor bus request0 signal 359 and bus request1-bus request3 signals 324 to detect a trailing edge. This indicates when access to processor bus 104A has been relinquished, thereby enabling priority logic 354 to identify the next unit to gain bus access. This process of monitoring request0 signal

359 and bus request1-bus request3, and then determining the next requester, is continued indefinitely until such as time as BC 114C is removed from the partition.

It will be appreciated that although the foregoing discussion utilizes BC 114C for exemplary purposes, the other BCs in the system include similar logic. Each BC executes a similar start sequence when being brought into a running partition. After a unit is executing within a running partition, it may continue executing in a normal manner while another unit is being brought into the partition. For example, assume that BC 114C is already executing within a partition that includes BC 114A. Assume further that BC 114B is being brought into the partition. This will first be visible when BC 114C detects BC 114B raising a respective one of bus request1-bus request3 signals to make a first request on processor bus 104A. As discussed previously, request control logic 358 of BC 114B will raise this signal in a manner that conforms to timing requirements of processor bus 104A, and which ensures that an instability problem will not be created within any of the other BCs on the processor bus. This bus request signal will be provided to priority logic 354 of BC 114C on lines 324. During normal operating mode (that is, when BC 114C is not in the process of being added to a partition), BC 114C is monitoring the trailing edges of bus request signals on lines 324 to determine when one of BCs 114 relinquishes processor bus 104A, as discussed above. When a BC 114 relinquishes processor bus 104A, the next unit to be granted bus access is determined by priority logic 354, and identified by signals captured within ID Register 360.

As can be appreciated by the above discussion, the system of FIG. 3 allows a unit to be dynamically added to an executing partition, even in an environment where more than two units are already making requests to the shared resource, which in the above example is processor bus 104A. The current invention ensures that handling of requests is synchronized among the units so that multiple requesters do not simultaneously attempt to gain access to the shared resource.

In one embodiment, dynamic scan register 302 of the current invention includes pause bit 310. When this bit is activated, a pause signal 361 is provided to request control logic 358 to prevent the assertion of bus requesto signal 359, or any other signal, on processor bus 104A. This allows BC 114C to remain synchronized with the other units on the bus, while at the same time temporarily preventing BC 114C from making additional requests to the bus. This may be used to alter the existing rotational priority scheme. For example, if processor 110A is executing a very high-priority task, pause bit 310 and similar logic within BC 114B and BC114D could be used to place BCs 114B-114D in a pause mode. This grants BC 114A continuous access to processor bus 104A so that the high priority task may be completed as quickly as possible.

According to one embodiment, the current invention allows a unit to be isolated from processor bus 104A when a unit is not included within a running partition. This is accomplished by providing bus interface logic 323, which prevents any signals from being driven onto, or received from, processor bus 104A, when bus interface enable bit 308 is not activated. As a result, when a unit such as BC 114C is not part of a running partition, the unit can be placed in a test partition wherein various test sequences may be executed on the unit. This allows diagnostic activities to be performed to isolate faults or to complete limited unit testing. These diagnostic activities can be completed while a running partition is utilizing processor bus 104A.

The system of FIG. 3 may be dynamically removed from a running partition in a manner that is similar to the manner in which it is added to the partition. First, the associated IP and SLC, which in this example include IP 110C and SLC 108C, are stopped in an orderly fashion. This ensures that all requests initiated by SLC 108C have been processed, and the IP and SLC logic is placed in an orderly state. After this occurs, request queue 356 will be empty. Next, a dynamic scan operation is performed to de-activate bus interface enable bit 308 and SLC interface enable bit 314. This disables bus interface logic 323 and SLC interface logic 320. In one embodiment, all of the state devices included within the logic shown in FIG. 3 may be initialized using scan interface 122 so that the logic is left in a known state after it has been removed from the partition. According to one aspect of this embodiment, the state devices can also be read via scan interface 122, providing a debug mechanism used to diagnose and isolate fault occurrences.

Figure 4:
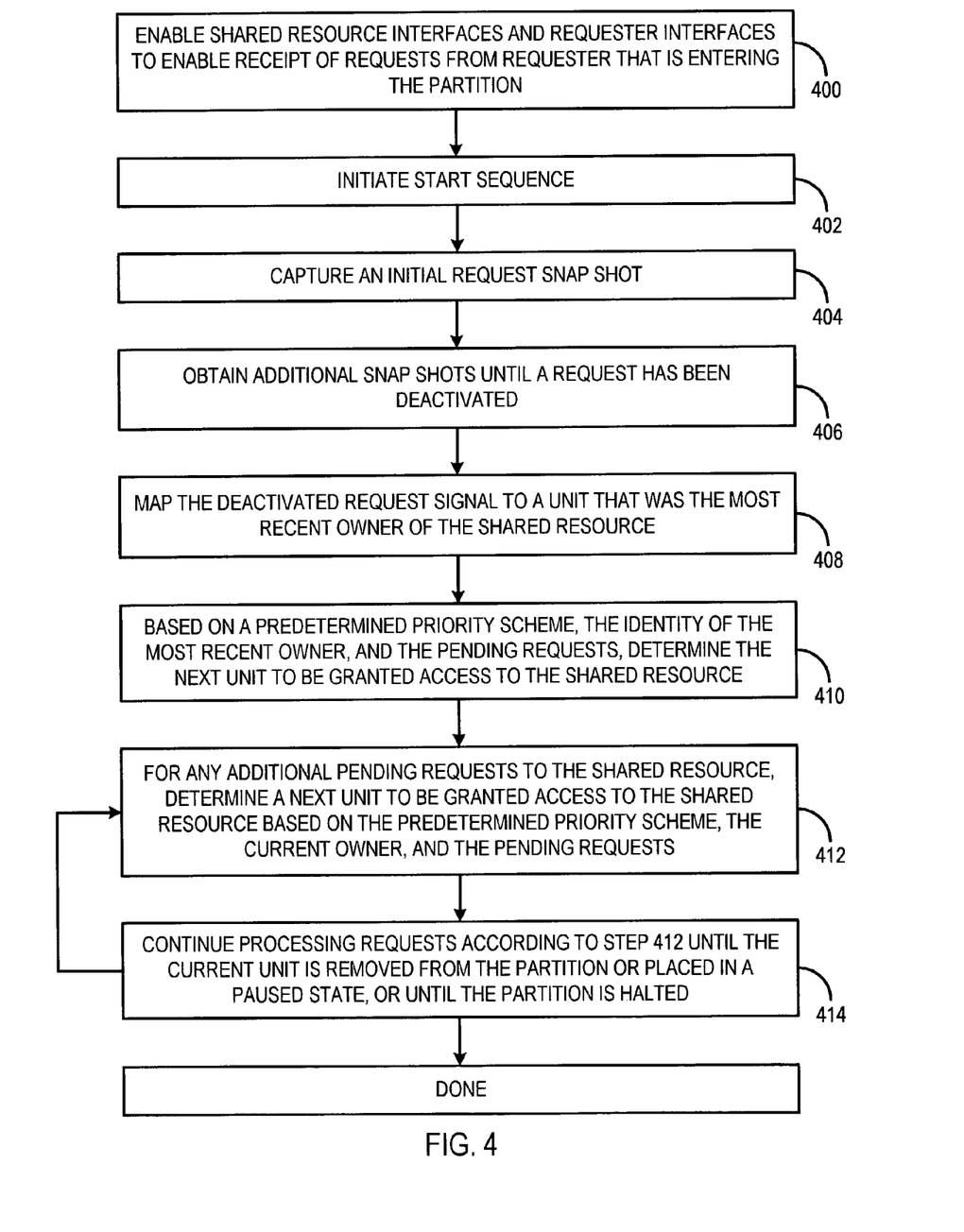
FIG. 4 is a flow diagram of one process according to the current invention.

FIG. 4 is a flow diagram illustrating one method of dynamically creating a partition according to the current invention. First, the interface to the shared resource and the interface to the requester are enabled (400). In the current example, this includes the interfaces to processor bus 104A and SLC 108C, respectively. This is accomplished using scan interface 122 and the various bits included within dynamic scan register 302. Next, a start sequence is initiated (402). This start sequence eventually results in the capture of an initial snapshot of all pending requests for those units that were already included within the partition (404). Next, additional snapshots of all pending requests are obtained until a request has been deactivated (406). This indicates one of the units already operating within the running partition has relinquished control of the shared resource. In one embodiment, the deactivated bus request signal is mapped to a unit identifier to determine the most recent owner of the shared resource (408). This is not necessary, however, and the identity of the request signal itself may be used to synchronized arbitration.

Next, based on a predetermined priority scheme, based on the identity of the most recent bus owner, and further based on the pending bus requests, the next unit to be granted access to the shared resource is determined (410). The arbitration logic within the current unit is now synchronized with the arbitration activities occurring within other units coupled to the shared resource.

For any additional pending requests, a next unit that will be granted access to the shared resource determined based on a predetermined priority scheme, the identity of the new current owner, and the pending requests (412). This next owner will be granted access to the shared resource when the current owner relinquishes the shared resource, based on deactivation of a respective request signal. This process is continued for the current unit until that unit is removed from the partition or placed in a paused state, or until the partition itself is halted (414).

It will be appreciated that many alternative embodiments of the foregoing system and method are possible within the scope of the current invention. For instance, the exemplary system discussed above included four units coupled to a processor bus. More or fewer units may be so coupled within the scope of the current invention. Additionally, although the above discussion relates primarily to requests made to a shared bus resource, any system wherein requests are made to gain access to any other type of communications network, or any other type of shared resource generally, may utilize the current invention. Further, although one embodiment of the current invention incorporates the dynamic partitioning circuit within a bus controller that is coupled to a cache, in another embodiment, the bus controller may be coupled directly to a processor without the use of the intermediate cache. Alternatively, the bus controller may be omitted, with the dynamic partitioning circuit and other bus control functionality being integrated within a processor or within a cache. In this case, the processor or cache, respectively, may be coupled directly to the shared resource. Moreover, the current invention may be practiced within the context of any other type of units that are coupled to a shared resource. Thus, the above-described embodiments are to be considered exemplary only, with the scope of the invention being indicated only by the claims that follow, rather than by the foregoing description.

What is claimed is:

1. A system comprising:
   a data processing partition including multiple units coupled to a shared resource;
   an additional unit initially disassociated with the data processing partition;
   a programmable circuit to enable the additional unit to begin making requests within the data processing partition while the multiple units are making requests to a shared resource;
   a snapshot circuit to determine when one of the multiple units has relinquished control of the shared resource; and
   priority logic coupled to the snapshot circuit and to the programmable circuit to synchronize request arbitration performed by the additional unit to request arbitration that is being performed by the multiple units originally associated with the data processing partition, synchronization being based on a determination as to which unit relinquished control of the shared resource.

2. The system of claim 1, and further including interface logic coupled to the snapshot circuit to enable the additional unit to the shared resource while one or more requests from the multiple units may be pending to the shared resource.

3. The system of claim 2, wherein the programmable circuit is coupled to control the interface logic.

4. The system of claim 3, and further including a scan interface coupled to allow the programmable circuit to be dynamically scanned.

5. The system of claim 1, wherein the snapshot circuit comprises:
   a first state device to capture an initial snapshot of requests pending to the shared resource;
   a second state device to capture at least one subsequent snapshot of requests pending to the shared resource; and
   a compare circuit to compare the initial snapshot to the at least one subsequent snapshot.

6. The system of claim 5, and further including combinational logic coupled to the compare circuit to map one of the requests to an associated one of the multiple units.

7. The system of claim 2, and further including a pause circuit coupled to the interface logic to temporarily prevent requests from the unit from being provided to the shared resource.

8. The system of claim 7, and further including a scan interface coupled to dynamically control the pause circuit.

9. The system of claim 1, wherein the priority logic includes logic to implement a programmable priority scheme.

10. A data processing system, comprising:
    a shared resource within a processing partition; and
    multiple units each coupled to make requests to the shared resource, at least one of the multiple units being initially disassociated with the processing partition and associated with a respective dynamic partitioning system that is capable of adding the respective one of the multiple units to the processing partition while requests are pending to the shared resource from other ones of the multiple units, the dynamic partitioning system comprising:
    interface logic to allow the respective unit to be selectively enabled to the shared resource;
    snapshot logic coupled to the interface logic to identify any one of the multiple other units currently granted access to the shared resource; and
    priority logic coupled to the snapshot logic to dynamically synchronize, based on which unit was identified by the snapshot logic, request arbitration being performed by the respective one of the multiple units to request arbitration being performed by each of the other ones of the multiple units.

11. The system of claim 10, wherein the shared resource is a communication network.

12. The system of claim 10, wherein the shared resource is a bus interface.

13. The system of claim 10, wherein at least one of the multiple units is selected from the group consisting of a processor, a cache, and a bus controller.

14. The system of claim 10, and further including a dynamically programmable circuit coupled to the interface logic to selectively enable the interface logic.

15. The system of claim 10, and further including a pause circuit coupled to the interface logic to selectively temporarily prevent the respective unit from making requests to the shared resource.

16. The system of claim 15, wherein the pause circuit is dynamically programmable.

17. The system of claim 10, wherein the priority logic operates according to a priority scheme that is programmable.

18. A method comprising:
    providing at least one executing partition of a data processing system, the partition including multiple units making requests to gain access to a shared resource based on a predetermined priority scheme;
    identifying an additional unit not associated with the executing partition of the data processing system to be dynamically added to the executing partition;
    programmably enabling the additional unit to begin making requests within the executing partition while other units that are already included in the executing partition are making requests;
    identifying any one of the multiple other units relinquishing access to the shared resource; and
    synchronizing the additional unit with the predetermined priority scheme based on the identity of the one of the multiple other units.

19. The method of claim 18, wherein the identifying step includes determining when one of the multiple other units completes a request to the shared resource.

20. The method of claim 19, and further including,
    obtaining multiple snapshots of all requests from the multiple other units that are pending to the shared resource; and
    determining when one of the requests is deactivated.

21. The method of claim 19, and further including mapping the one of the requests to a unit identifier.

22. The method of claim 19, wherein the enabling step includes dynamically enabling the additional unit to the shared resource using a scan interface.

23. The method of claim 18, wherein the synchronizing step includes determining which one of the unit or the multiple other units will next gain access to the shared resource.

24. The method of claim 23, wherein the determining step includes determining which requests are pending to the shared resource.

25. The method of claim 18, and further including:

monitoring all pending requests to the shared resource issued by the additional unit or the multiple other units to determine when a request has been completed; and granting access to the shared resource based on the pending requests and on the predetermined priority scheme.

26. The method of claim 18, and further including pausing the additional unit, thereby temporarily denying access of the additional unit to the shared resource.

27. The method of claim 18, and further including removing the additional unit from the executing partition while the multiple other units are making requests to gain access to the shared resource.

28. A partitioning system having an operational data processing partition that includes multiple units coupled to a shared resource, the partitioning system comprising:

programmable dynamic scan means for adding a unit to the data processing partition while other units are making requests to the shared resource;

snapshot means for identifying one of the multiple other units relinquishing access to the shared resource within a predetermined period of time; and priority logic means for granting access to the shared resource based on a predetermined priority scheme, and for utilizing an identity of the one of the multiple units to synchronize any requests from the additional unit with the predetermined priority scheme.

29. The partitioning system of claim 28, and further including interface means for enabling the additional unit to make requests to the shared resource while the shared resource is capable of receiving requests from the multiple other units.

30. The partitioning system of claim 29, and further including pause means for temporarily suppressing requests from the additional unit to the shared resource after the additional unit is enabled to the shared resource.

* * * * *